United States Patent

Chao et al.

[11] Patent Number: 5,544,116
[45] Date of Patent: Aug. 6, 1996

[54] ERASE AND PROGRAM VERIFICATION CIRCUIT FOR NON-VOLATILE MEMORY

[75] Inventors: Liang Chao, Hsinchu, China; Tien-Ler Lin, Cupertino; Tom D. Yiu, Milpitas, both of Calif.

[73] Assignee: Macronix International Co., Ltd., Hsinchu, Taiwan

[21] Appl. No.: 444,672

[22] Filed: May 19, 1995

Related U.S. Application Data

[62] Division of Ser. No. 108,670, Aug. 31, 1993, Pat. No. 5,463,586.

[51] Int. Cl.[6] .............................. G11C 7/00; G11C 29/00
[52] U.S. Cl. ............... 365/210; 365/189.07; 365/189.09; 365/207
[58] Field of Search .............................. 365/900, 189.09, 365/210, 207, 226, 185, 189.07

[56] References Cited

U.S. PATENT DOCUMENTS

5,142,495  8/1992  Camepa .............................. 365/104 X
5,142,496  8/1992  Van Buskirk ....................... 365/104 X
5,163,021  11/1992  Mehrotra et al. .................. 365/104 X

*Primary Examiner*—Do Hyun Yoo
*Attorney, Agent, or Firm*—Haynes & Davis

[57] ABSTRACT

For non-volatile memory devices, such as flash EPROM integrated circuits, which have memory cells and reference cells, and sense circuitry responsive to addressed memory cells and the reference cells, and in which a read potential is supplied to the gate of the selected memory cells and a reference potential is supplied to the gate of a reference memory cell during a read mode, the state of the programmable memory cells is verified by (1) supplying a first verify potential to the gate of an address programmable memory cell; and (2) supplying a second verify potential to the gate of the reference cell which is different from the first verify potential. Because cell current is a very strong function of the gate voltage, applying different gate voltages to the memory and reference cells is equivalent to adjusting the sense ratio. When the method is applied for program verify, then the second verify potential applied to the reference cell is less than the first verify potential applied to the addressed programmable memory cell. When the method is applied for erase verify, the second verify potential is greater than the first verify potential.

7 Claims, 7 Drawing Sheets

ERASE AND PROGRAM VERIFICATION CIRCUIT FOR NON-VOLATILE MEMORY

This application is a divisional of application Ser. No. 08/108,670, Filed Aug. 31, 1993 now U.S. Pat. No. 5,463,586.

BACKGROUND OF THE INVENTION

1. Field of the Invention

The present invention relates to the design of erasable and programmable non-volatile memory devices; and more particularly to circuits for verifying a programmed or erased state of memory cells in the device, suited for flash EPROM or EEPROM memory cells.

2. Description of Related Art

Non-volatile memory design based on integrated circuit technology represents an expanding field. One popular class of non-volatile memory cell is known as the erasable-programmable read only memory (EPROM). Two popular EPROM designs are distinguished in the manner in which erasure of the memory cells is carried out. The first is referred to as the EEPROM which uses an electrical erasure routine that involves relatively high voltage. A second member of this class is known as the flash EPROM which uses a lower voltage erasing technique.

Both the flash EPROM and EEPROM technologies are based on a memory cell which consists of a source, channel, and drain with a floating gate over the channel and a control gate isolated from the floating gate. The act of programming the cell involves charging the floating gate with electrons, which causes the turn on threshold of the memory cell to increase. Thus, when programmed the cell will not turn on, that is it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

Both the flash EPROM and EEPROM memory cells suffer the problem of over-erasure. Over-erasure occurs if, during the erasing step, too many electrons are removed from the floating gate leaving a slight positive charge. This biases the memory cell slightly on, so that a small current may leak through the memory cell even when it is not addressed. A number of over-erased cells along a given bit line can cause an accumulation of leakage current sufficient to cause a false reading. The regular EEPROM design uses a two transistor cell structure which includes a pass gate that isolates the memory cell from the bit line, so that unselected memory cells do not contribute leakage current to the bit line. The flash EPROM cell does not use the isolation transistor, so over-erasure causes a significant problem in the flash EPROM design.

Over-erasure also illustrates an important phenomenon involved with the programming and erasing of floating gate memory cells. That is, the amount of charge which is moved into the floating gate during a given programming phase or moved out of the floating gate during a given erasure phase cannot always be tightly controlled. This amount of charge depends on such factors as the temperature of the cell at the time of the operation, variations in the cells which occur due to processing technology, cell aging, and other factors.

Therefore, commercial flash EPROM designs include circuitry for verifying the success of programming and erasing steps. See, for instance, U.S. Pat. No. 4,875,788, entitled VOLTAGE MARGINING CIRCUIT FOR FLASH EPROM, invented by Jungroth. The prior art devices include a first mode for verifying the programming of the cell during which the potential supplied to the control gate of the cell (across word lines in the memory array) is increased above the normal read potential. Thus, the Jungroth patent provides for applying a 5 V potential to the cell for normal read operations, and a higher potential of approximately 7.5 V during the program verify. By performing program verify with a higher voltage on the control gate, the circuit ensures that the programming step resulted in injection of a sufficient number of electrons into the floating gate to raise the turn on threshold with a safe margin over the minimum amount required. Similarly, during erase verify, the voltage on the control gate is reduced by Jungroth to approximately 3.25 V instead of 5 V. If the cell conducts with 3.25 V applied to its control gate, then it will surely conduct if the read potential of 5 V is applied. Again, this ensures removal of a sufficient amount of charge from the floating gate with a significant margin for safety over the minimum required removal for successful erase.

The standard sensing technology applied to flash EPROM cells involves a differential sense amp which has one input connected to a bit line of a selected cell, and a second input connected to the bit line of a reference cell. The effective resistive load R1 on the bit line of the selected cell and the effective resistive load R2 on the bit line of the reference cell have an effect on the sensing operation known as the sense ratio. Thus, the ratio of R1/R2 determines the ratio of current on the selected cell to current on the reference cell which triggers the sense amp to indicate a conductive state of the memory cell. For instance, a sense ratio of 2.5 will require a current level on the selected bit line of 40% of the current on the reference bit line to indicate a conductive state of the cell.

Prior art systems for verifying programming and erasing, change the level of voltage applied to the control gates of both the memory and reference cells together. To provide further margin, the prior art systems have manipulated the load on the bit lines to the sense ratio by increasing the sense ratio from approximately 2.5 to say approximately 4 during program verify. With a sense ratio of 4, a lower level of current on the selected bit line (25% of the current on the reference bit line) is required to trip the sense amp. Similarly, reducing the sense ratio below 2.5 during erase verify is used to increase the amount of current required on the selected bit line to trip the sense amp.

While prior art designs have used a combination of voltage margining on the word lines and sense ratio adjustment based on increasing or decreasing the resistive load of the bit lines, these systems continue to have certain disadvantages. In particular, it is difficult to finely adjust the load of the bit lines to control the sense ratio. This can be done by switching transistors on and off on the load to reduce or increase the resistance. However, the granularity of such techniques is rather crude.

Accordingly, there is a need for an erase verify and program verify circuit for flash EPROMs and other non-volatile memory cells, which allows for finer control of the verify margins involved.

SUMMARY OF THE INVENTION

The present invention provides a technique for much finer control over the design of verify circuits for non-volatile memory devices. Also, the verification potentials are also much closer to the normal read voltage. For non-volatile memory devices which have memory cells and reference cells, and sense circuitry responsive to addressed memory cells and the reference cells, and in which a read potential is supplied to the gate of the selected memory cells and the reference potential is supplied to the gate of a reference memory cell during a read mode, the invention can be characterized as a method for verifying the state of the programmable memory cells which comprises:

supplying a first verify potential to the gate of an addressed programmable memory cell; and supplying a second verify potential to the gate of the reference cell which is different from the first verify potential.

Because cell current is a very strong function of the gate voltage, applying different gate voltages to the memory and reference cells is effectively equivalent to adjusting the sense ratio. However, the granularity of the adjustments available are much finer. Also, the technique can be applied to systems with or without circuits for altering the load on the selected and reference bit lines to control the sense ratio during the verify modes.

According to one aspect of the method, the reference potential and the read potential which are applied to the cells during the read mode are substantially equal. When the method is applied to verify the state of programmable memory cells which is not conductive in response to a read potential (program verify), then the second verify potential applied to the reference cell is less than the first verify potential applied to the addressed programmable memory cell.

When the method is applied to verify state of a programmable memory cell which is conductive in response to a read potential (erase verify), the second verify potential is greater than the first verify potential.

The invention can also be characterized as a programmable non-volatile memory device which includes an array of memory cells, and sense circuitry having a reference cell. The sense circuitry detects the state of an addressed memory cell with reference to the output of the reference cell. A voltage supply circuit supplies energizing voltage to the control terminals of the selected memory cells and to the reference cell, to enable the difference in outputs from the selected memory cell and the reference cell to indicate a state of the selected memory cell. Control circuitry is provided for carrying out the method described above which includes a read mode during which energizing voltage for the memory cells in the array is at a read potential and the energizing voltage of the reference cell is at a reference potential, and a verify mode in which the energizing voltage for the array is a first verify potential, and the energizing voltage for the reference cell is a second verify potential different from the first verify potential.

The device may include memory cells which consist of flash EPROM cells in a preferred system. Alternatively, the memory cells may consist of electrically erasable EPROM cells, or other related non-volatile cells.

According to yet another aspect of the present invention, a flash EPROM integrated circuit is provided. The integrated circuit includes a memory array of flash EPROM memory cells having gates, sources, and drains. A plurality of bit lines traverse the memory array, each bit line coupled to the drains of a column of cells in the array. A plurality of word lines similarly traverse the memory array, with each word line coupled to the gates of a row of cells in the memory array. The integrated circuit includes a reference array which includes at least one column of flash EPROM memory cells having gates, sources, and drains. A reference bit line is coupled to the drains of a reference column of cells in the reference array. Sense circuitry is coupled to the plurality of bit lines in the memory array and the reference bit line, for detecting a state of a selected memory cell in response to the state of the bit lines.

According to the present invention, the integrated circuit also includes a controllable voltage source which is coupled to the word lines in the memory array, and to at least one cell in the reference column in the reference array, for supplying a read energizing potential to selected word lines in the memory array and a reference energizing potential to a gate of at least one cell in the reference column of the reference array. The controllable voltage source has a read mode, an erase verify mode, and a program verify mode, during which the read energizing potential and the reference energizing potential may be independently set. In the read mode, the read energizing potential has a first particular level and the reference energizing potential has a second particular level, which may be substantially equal to the first particular level. In the erase verify mode, the read energizing potential has a third particular level and the reference energizing potential has a fourth particular level, and in which the third particular level is less than the fourth particular level. During the program verify mode, the read energizing potential has a fifth particular level and the reference energizing potential has a sixth particular level and in which the fifth particular level is greater than the sixth particular level.

By controlling the energizing potential on the memory array and the reference array separately, in a system in which the sense circuitry is characterized by a sense ratio which is inversely proportional to an amount of current in a selected bit line relative to an amount of current in the reference bit line which indicates a conductive state of a selective cell, the third and fourth particular levels are selected to effectively lower the sense ratio during the erase verify mode by applying lower energizing potential to the selected cell than to the reference cell. Similarly, the fifth and sixth particular levels are selected to effectively raise the sense ratio during the program verify mode by applying higher energizing potential to the selected memory cell than to the reference cell.

According to a further aspect, the integrated circuit according to the present invention, includes an input for supplying a program potential $V_{PP}$ which is substantially 12 V±0.6 V, as well as a normal potential $V_{DD}$ which is substantially 5 V±0.5 V. The controllable voltage source, according to the present invention, uses a voltage divider derived from the $V_{PP}$ potential which has a less percentage variation than the $V_{DD}$ potential. This results in less variation in the verify mode potentials applied to the gates of the transistors.

According to another aspect, the voltage divider is composed of a series of p-channel MOS transistors connected in a diode configuration. Further, the p-channel transistors are formed in n-wells, with the n-well coupled to the source terminal. This achieves a stable voltage divider consuming less die area and consuming less power than prior art resistance dividers.

According to yet another aspect, the voltage applied to the word lines in the memory array is supplied through a controllable voltage driver which supplies a read potential, a program verify potential, and an erase verify potential to a selected word line in the memory cell array. This driver includes an n-channel MOS transistor which has a threshold voltage that affects the output level of the driver. In this aspect, the voltage divider based on the series connected p-channel transistors, includes an n-channel compensation transistor in series with the p-channel transistors. This way, variations in the threshold of the n-channel transistor in the word line driver are offset in the voltage divider so that the verify voltage does not depend on the n-channel transistor threshold voltage variations.

According to yet another aspect of the present invention, the controllable voltage source according to the present invention can be applied to an integrated circuit in combination with a circuit for controlling the load on the bit lines of the memory cell and the reference cell independently. Thus, the sense ratio can be directly adjusted by adjusting the resistive load on the bit lines, in combination with the effective adjustment accomplished by varying the energizing potentials to the gates of the memory and reference cells, respectively.

The present invention provides a flexible and efficient design for implementing erase and program verify modes on non-volatile memory devices, such as flash EPROM integrated circuits. The design provides for precise control of energizing potential to the word lines of the memory array and the reference array, and independent control of the levels of such energizing potentials for the read, erase verify, and program verify modes. The design is easily adjusted to provide for built-in margin voltages with very fine granularity of control over margins applied.

Other aspects and advantages of the present invention can be seen upon review of the figures, the detailed description, and the claims which follow.

DESCRIPTION OF THE PREFERRED EMBODIMENTS

Figure 1:
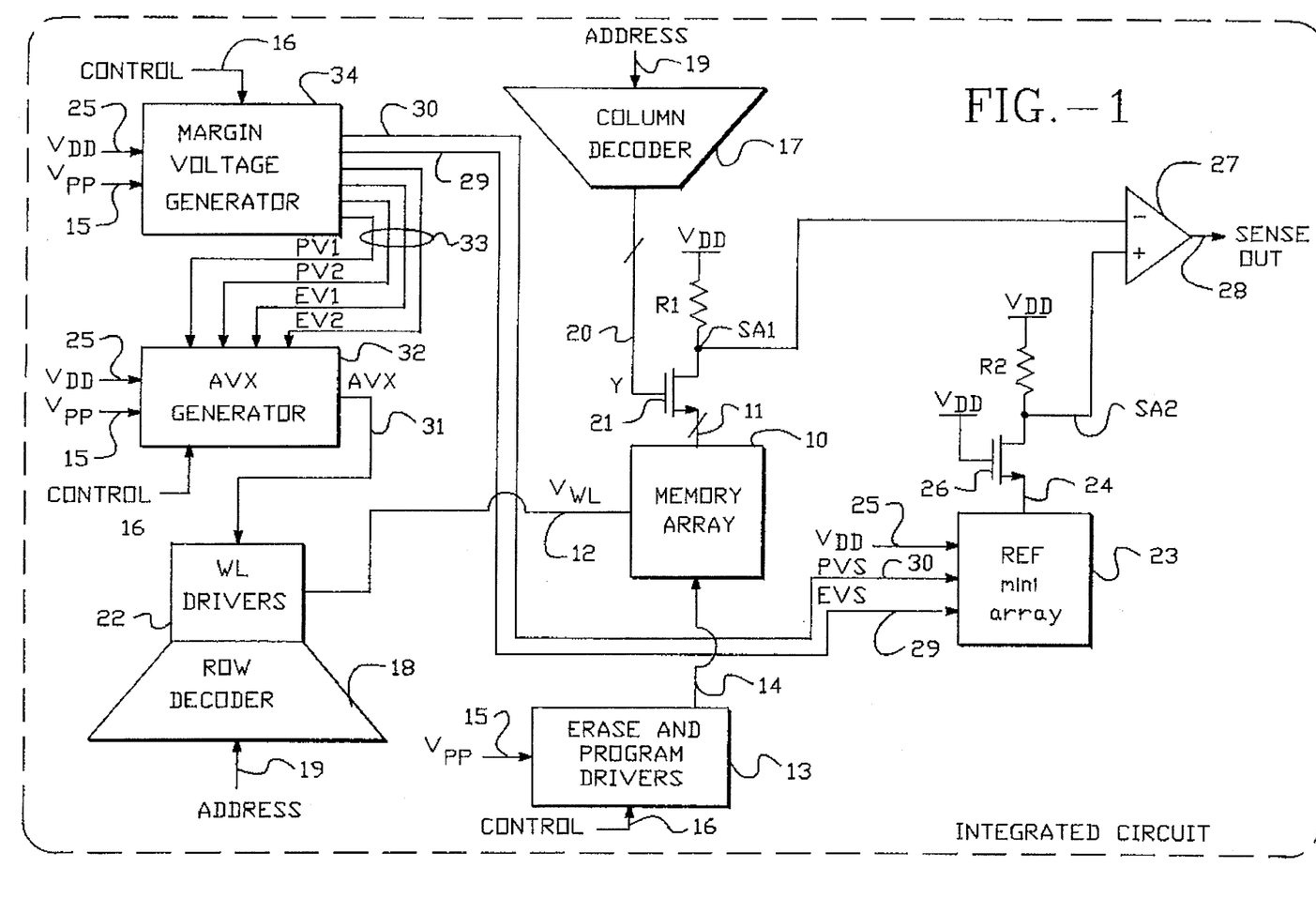
FIG. 1 is a schematic block diagram of an integrated circuit, non-volatile memory device according to the present invention.
Figure 2:
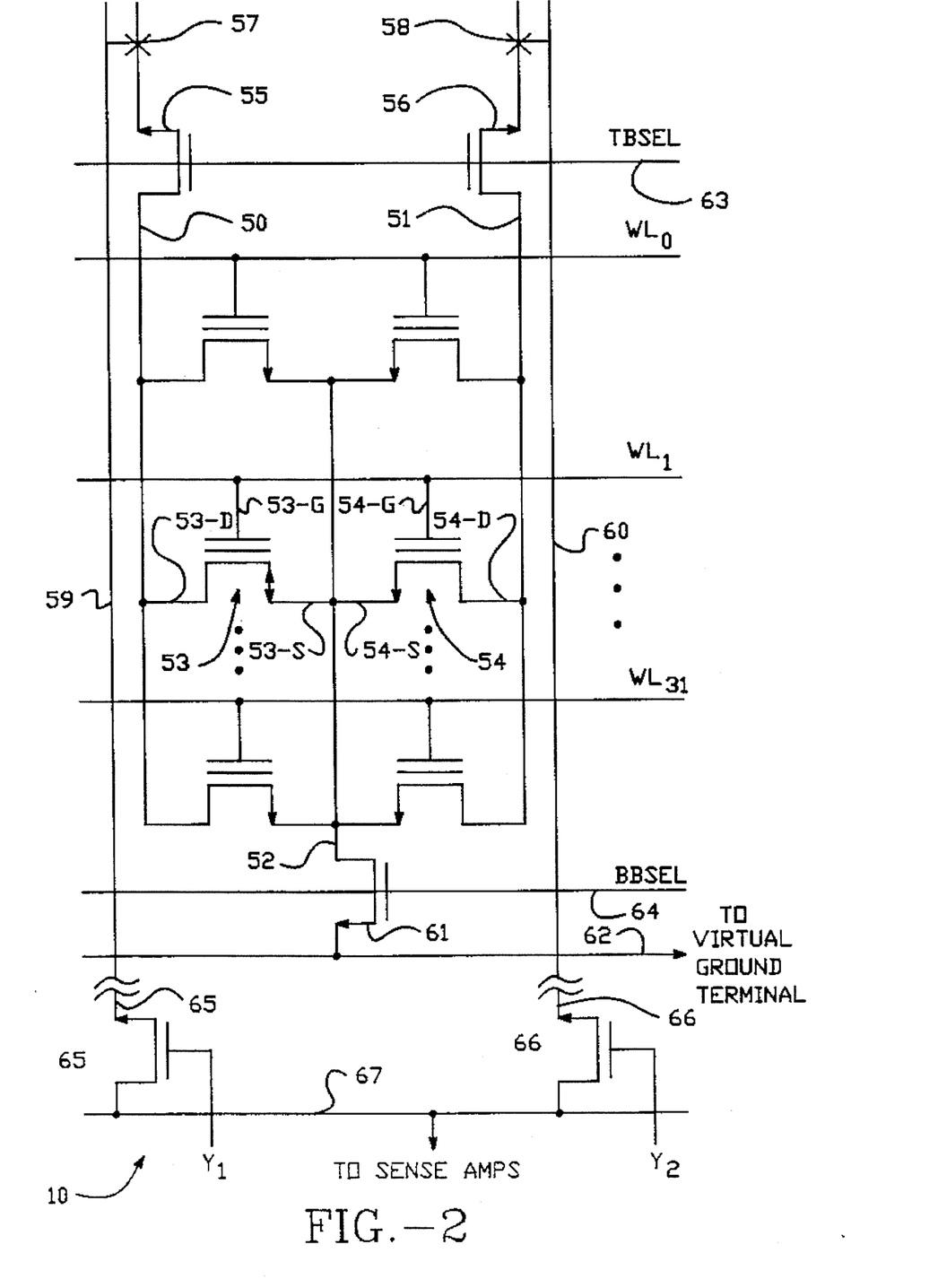
FIG. 2 is a schematic diagram of a section of a memory array according to a preferred embodiment of the present invention.

A detailed description of preferred embodiments is provided with respect to FIGS. 1–8. FIG. 1 provides a simplified schematic diagram of an integrated circuit flash EPROM device according to the present invention. FIG. 2 illustrates one preferred embodiment of the flash EPROM memory array architecture and cell structure. FIGS. 3–8 illustrate implementations of the primary functional blocks of FIG. 1 for a system using the memory cell structure of FIG. 2.

As shown in FIG. 1, an integrated circuit, non-volatile memory device includes a memory array 10 which includes a plurality of rows and columns of memory cells. The columns are defined by a plurality of cells which are coupled to a bit line 11. The rows are defined by pluralities of cells which are coupled to a word line 12. In the figure, a single bit line 11, and a single word line 12 are illustrated for the purpose of clarity, but are representative of the word lines and bit lines for the entire array. It will be understood that the architecture for the memory 10 can take on a variety of structures. A preferred system may include the architecture specified in our co-pending U.S. patent application entitled NON-VOLATILE MEMORY CELL AND ARRAY ARCHITECTURE, Ser. No. 07/823,882, filed Jan. 22, 1992, now abandoned, which was owned at the time of filing and is currently owned by the same Assignee as the present application.

The memory array 10 includes non-volatile memory cells which are characterized by floating gate structures, such as flash EPROM cells or EEPROM cells. Thus, the integrated circuit includes erase and program drivers 13 which are coupled, as schematically illustrated, across line 14 to the memory array 10. The erase and program drivers receive a programming potential $V_{PP}$ on line 15 from either on or off chip circuitry, as appropriate, for the purposes of establishing the high voltages needed in the erase and program operations. Also, control signals 16 are supplied to the erase and program drivers 13 to establish the appropriate states for the program and erase functions.

Cells within the memory array 10 are selected using a column decoder 17 and a row decoder 18, which are responsive to the address 19 which is supplied to the chip. The column decoder 17 generates the signal Y on line 20 which drives a column select transistor 21 on each bit line 11.

The row decoder 18 controls word line drivers 22 which generate a voltage $V_{WL}$ on the word line 12 for a selected row of the memory array 10.

The integrated circuit also includes a reference mini-array 23 which includes at least one column of memory cells coupled to a reference bit line 24. A supply potential $V_{DD}$ is supplied on line 25 to the circuit in general, and the mini-array 23, and coupled during normal read operations to a word line in the reference mini-array 23. A column select transistor 26 for the reference bit line 24 is left in an on condition by charging its gate to the potential $V_{DD}$.

The state of a selected memory cell in the memory array 10 is detected by sense circuitry 27 which detects differences in the amounts of current flowing on the bit line 11 and on the reference bit line 24 as indicated by the voltages at nodes SA1 and SA2, respectively. The memory bit line 11 includes an effective resistive load R1 from the node SA1 to the power supply $V_{DD}$. Similarly, the reference bit line 24 includes an effective resistive load R2 from node SA2 to the power supply $V_{DD}$. The resistors R1 and R2 shown in FIG. 1 schematically represent the resistive load of the bit line circuitry which may be based on load transistors or resistors or a combination of devices as suits a particular design.

The ratio of the resistance R1 to the resistance R2 defines a parameter known as the sense ratio SR for the sense circuitry 27, because the values of these resistances are determinative of a trip current for the memory bit line 11 which will cause the sense amplifier 27 to indicate an output on line 28 corresponding to a conductive state of a selected memory cell in the array 10. The sense ratio for the present application is defined as the ratio of resistance R1/R2. For a sense ratio of 2.5, the trip current is defined as 1/2.5 of the current on reference bit line 24, or 40% of the current on the reference bit line 24. Thus, if below 40% of the reference current is flowing on bit line 11, a non-conductive state is indicated by the sense circuitry 27. If greater than 40% of the reference current is flowing on the memory bit line 11, then a conductive state of the memory cell is indicated by the sense circuitry 27.

As mentioned above, the erase and program operations which are executed under control of the erase and program drivers 13 are followed by respective erase verify and program verify operations.

According to the present invention, the voltage $V_{WL}$ on the word line 12 has a first particular value during a normal read operation which is substantially $V_{DD}$, and a cell in the reference mini-array 23 is energized by a second particular level, which is again substantially the voltage $V_{DD}$ on line 25 in the embodiment described. The first and second particular values may or may not be equal, as suits the needs of a particular design.

During the erase verify mode, the voltage $V_{WL}$ on line 12 has a third particular value, and a cell in the reference mini-array 23 is energized with an erase verify source voltage on line 29 which has a fourth particular value EVS.

In the program verify mode, the voltage $V_{WL}$ on line 12 has a fifth particular value. Also, a cell in the reference mini-array 23 is energized with a program verify source voltage on line 30 which has a sixth particular value PVS.

The voltage on the word line 12 is driven through word line driver 22 in response to the source voltage AVX on line 31. Line 31 is driven by the AVX generator 32. The AVX generator 32 receives as inputs the $V_{DD}$ potential 25, the $V_{PP}$ potential 15, and control signals 16. Also, the AVX generator 32 receives controlled reference voltages PV1, PV2, EV1, and EV2 across lines 33 from a margin voltage generator 34. The inputs to the margin voltage generator 34 include $V_{DD}$ 25, $V_{PP}$ 15, and control signals 16. Also, the margin voltage generator 34 supplies the PVS voltage on line 30 and the EVS voltage on line 29.

The AVX generator 32 supplies substantially $V_{DD}$ on line 31 during the read mode. During program verify, the voltage AVX is generated in response to the values PV1 and PV2 so that an energizing level on the word line 12 higher than $V_{DD}$ is established. During erase verify, the voltage AVX is generated in response to EV1 and EV2 so that a voltage level on the word line 12 is established which is less than $V_{DD}$.

During the normal read mode, the $V_{DD}$ signal on line 25 energizes a cell in the reference mini-array 23 so that the cell in the reference mini-array and the selected memory cell and the memory array 10 are energized by substantially the same gate voltage. In this mode, the sense ratio is effectively set by the resistances R1 and R2.

During erase verify, the EVS signal on line 29 is energized and is coupled to a cell in the reference mini-array 23, while $V_{DD}$ and PVS are disconnected from the reference mini-array word lines. In this mode, the voltage EVS 29 is higher than the energizing voltage on the word line 12.

Because the current generated by flash EPROM cells and similar memory cells based on floating gates, is a strong function of the word line voltage, applying a higher word line voltage to the reference cell than to the selected cell in the memory array has the effect of inducing relatively greater current flow in the reference bit line 24 than in the memory bit line 11. The erase verify mode expects to find a conductive state of the memory cell. Therefore, the current on the memory bit line 11 must be high enough to trip the sense amplifier 27 with the sense ratio set by resistances R1 and R2. However, because the reference cell in the reference mini-array 23 is driven harder than the selected memory cell in the memory array 10, the selected memory cell must be relatively more conductive in order to trip the sense circuitry 27. This provides a margin for erase verify without the need for, or in addition to, altering the ratio R1:R2.

During program verify, the voltage on word line 12 is energized to a value higher than $V_{DD}$. The voltage PVS on line 30 is enabled at a level which is less than the voltage on the word line 12, while EVS and the word line coupled to $V_{DD}$ 25 are disabled. Thus, the selected memory cell in the memory array is driven harder than the memory cell in the reference mini-array 23, tending to cause a relatively higher current flow on the bit line 11 than on the reference bit line 24. During program verify, the system expects to find a non-conductive state of the selected memory cell. Thus, by driving the selected memory cell 10 harder than the reference memory cell in the reference array 23, a program verify margin is established, again without, or in addition to, altering the ratio R1:R2.

Figure 3:
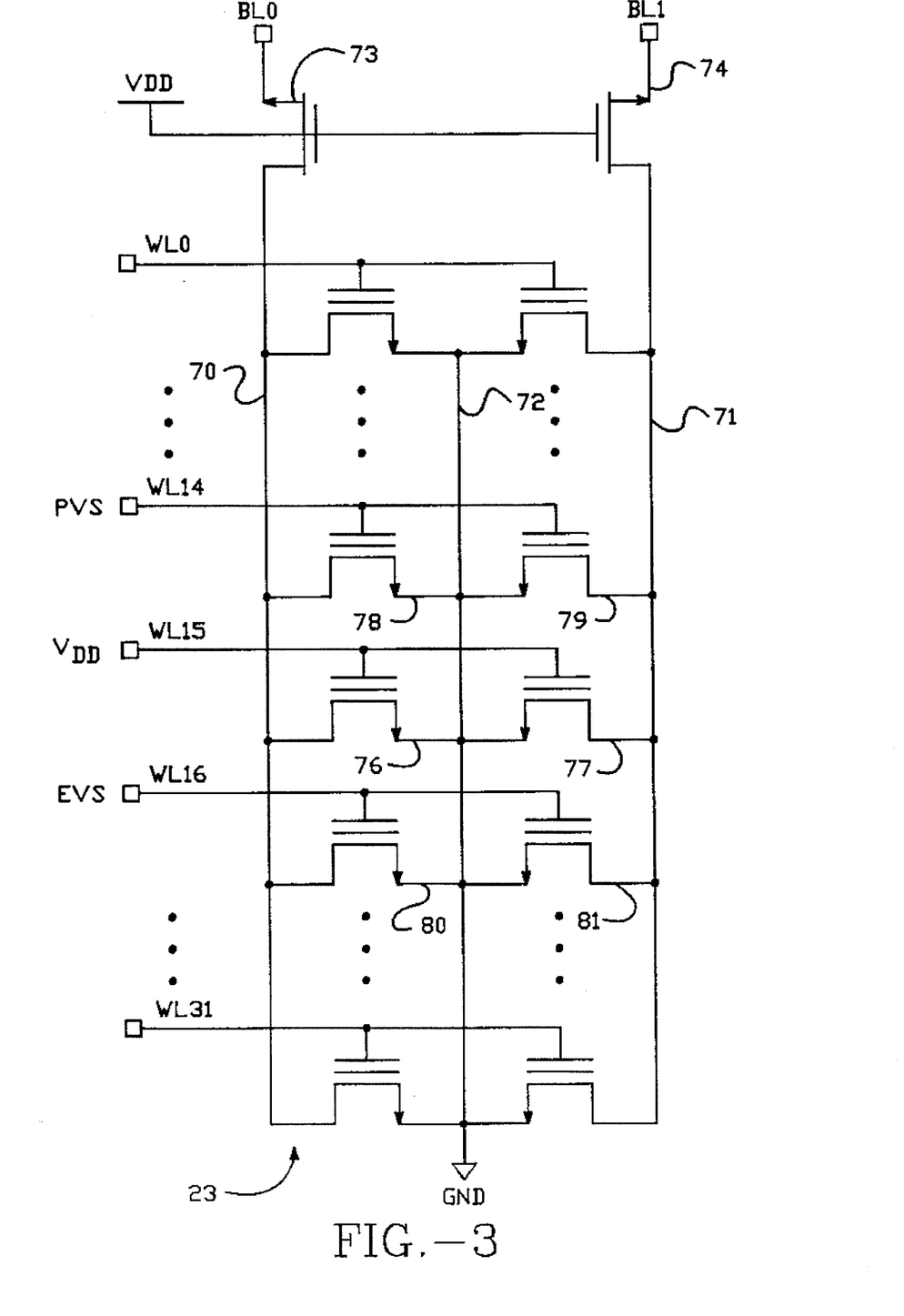
FIG. 3 is a schematic diagram of a section of a reference array according to a preferred embodiment of the present invention.

A detailed description of an implementation of a preferred embodiment of the present invention is provided with respect to FIGS. 2–8. FIGS. 2 and 3 illustrate the structure of the memory array 10 and the reference mini-array 23, respectively.

FIG. 2 illustrates the configuration of the flash EPROM circuit for use in a preferred embodiment of the present invention. The flash EPROM circuit includes a drain-source-drain configuration where two columns of memory cells have sources coupled to a local virtual ground line 52. The drains of a left hand column of cells are coupled to a local bit line 50 and the drains of the right hand column are coupled to local bit line 51. Thus, for example, memory cell 53 has a source coupled to virtual ground line 52 and a drain coupled to local bit line 50. Memory cell 54 includes a source coupled to virtual ground line 52 and a drain coupled to local bit line 51. The gates of the memory cells are coupled to word lines $WL_0$, $WL_1$, . . . , $WL_{31}$, for a 32 row high column. Thus, the control gates of the floating gate transistors 53 and 54 are coupled to word line $WL_1$.

The local bit lines 50 and 51 are coupled through top block select transistors 55 and 56, respectively, through diffusion to metal contacts 57 and 58 to global bit lines 59 and 60, respectively. The local virtual ground line 52 is coupled through a bottom block select transistor 61 to a virtual ground line 62. The top block select transistors 55, 56 are controlled by the signal TBSEL on line 63 and the bottom block select transistors are controlled by the signal BBSEL on line 64.

The global bit lines are coupled through column select transistors 65 and 66 as an input to the sense amps on lines 67. The column select transistors 65 and 66 are controlled by the output of the column decoder circuit 17, as shown in FIG. 1.

Each of the word lines $WL_0$ through $WL_{31}$ is driven by a word line driver, such as word line driver 22, shown in FIG. 1, such that the energizing voltage applied to the word line can be any one off a set of particular values, depending on whether the chip is in the read, program, program verify, erase, or erase verify modes. Similarly, the virtual ground terminal on line 62 and the bit lines through line 67 are controlled in dependence on the mode of the circuit.

As can be seen, the bit lines 59 and 60 continue vertically to another pair of columns of cells which are a mirror image of the set shown in the figure. Also, there are a plurality of sets of memory cell columns which make up the entire memory array. In the preferred system, there may be one megabit or more of storage per device.

As shown in FIG. 3, the reference mini-array 23 is implemented with similar structures. Thus, the reference mini-array will include at least one pair of columns of cells which include a local bit line 70 for the left side and a local bit line 71 for the right side. The sources of the left and right column memory cells are coupled to a local virtual ground line 72. The reference mini-array includes a column of 32 cell pairs coupled to word line $WL_0$ through $WL_{31}$. Top block select transistors 73 and 74 are coupled to $V_{DD}$ to establish an on state for both columns. The outputs BL0 and BL1 are coupled to respective reference bit lines for supply to the sensing circuitry.

The bottom block select transistor 61 of FIG. 2 is not used in FIG. 3. Rather, the terminal of the local virtual ground line is coupled to ground directly.

In normal read mode, the word line $WL_{15}$ is coupled to $V_{DD}$ to energize cells 76 and 77 and generate a reference current for the normal read mode. During program verify, the word line $WL_{14}$ is coupled to the PVS voltage to energize cells 78 and 79 and establish a reference current for program verify. During the erase verify mode, the word line $WL_{16}$ is coupled to EVS to energize cells 80 and 81 and establish a reference current for erase verify. The word lines of all of the other transistors in the array, $WL_0$ through $WL_{13}$, and $WL_{17}$ through $WL_{31}$, are coupled to ground.

Figure 4:
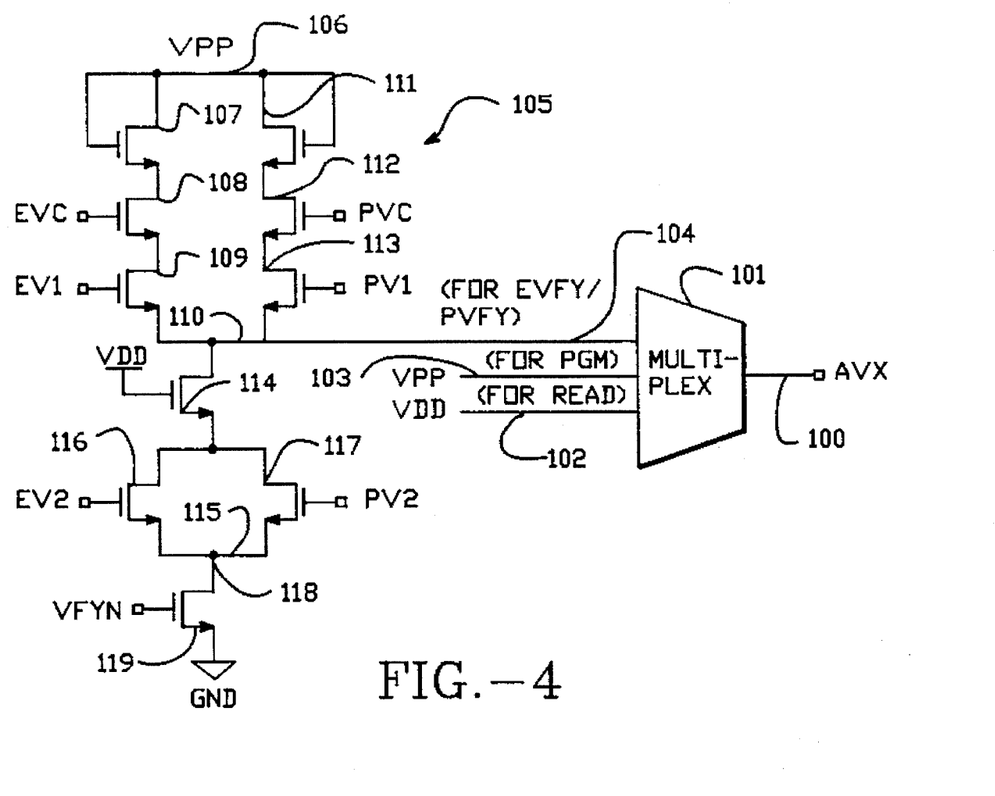
FIG. 4 is a schematic diagram of the AVX generator for the system of FIG. 1.
Figure 5:
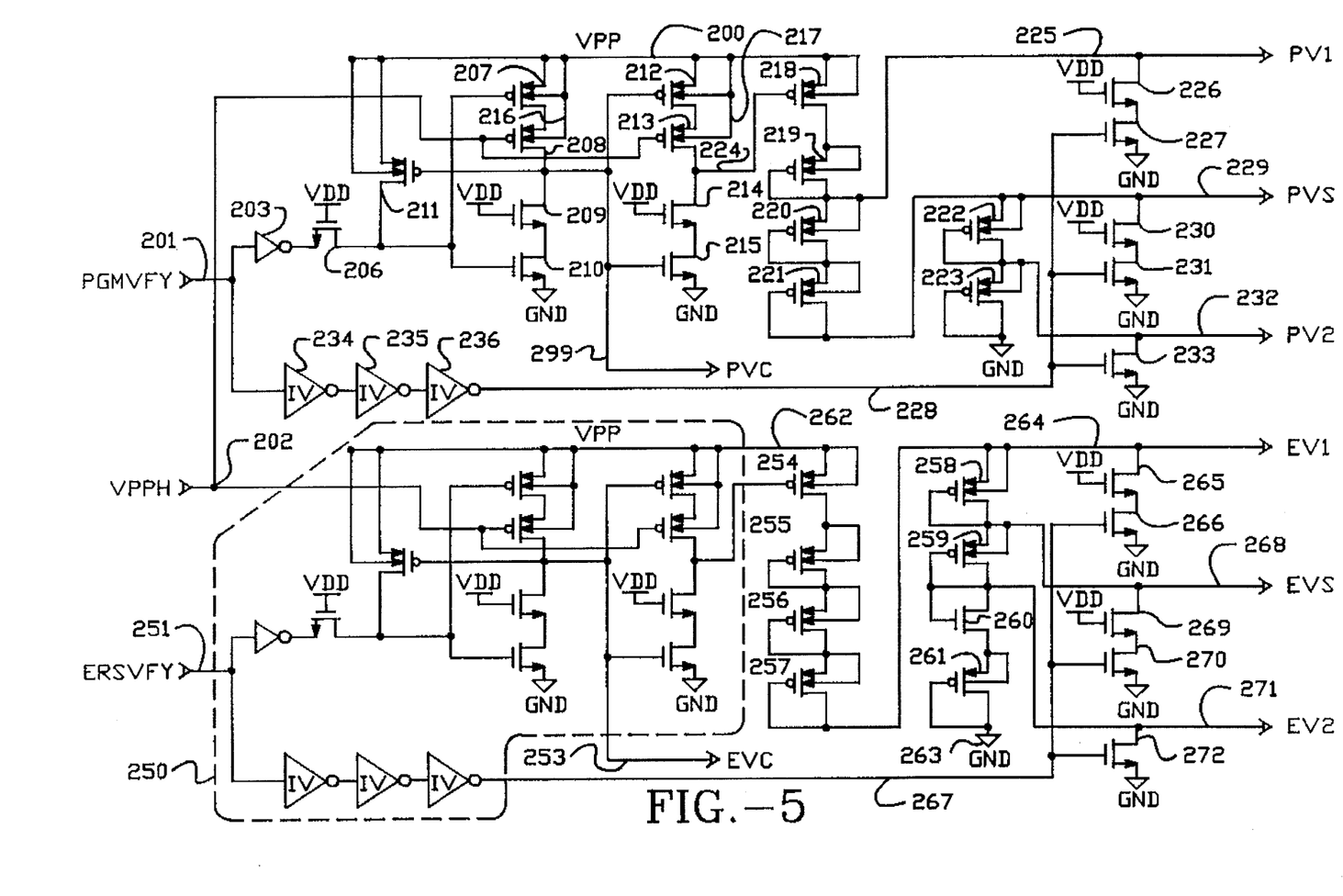
FIG. 5 is a schematic diagram of the margin voltage generator for the system of FIG. 1.
Figure 6:
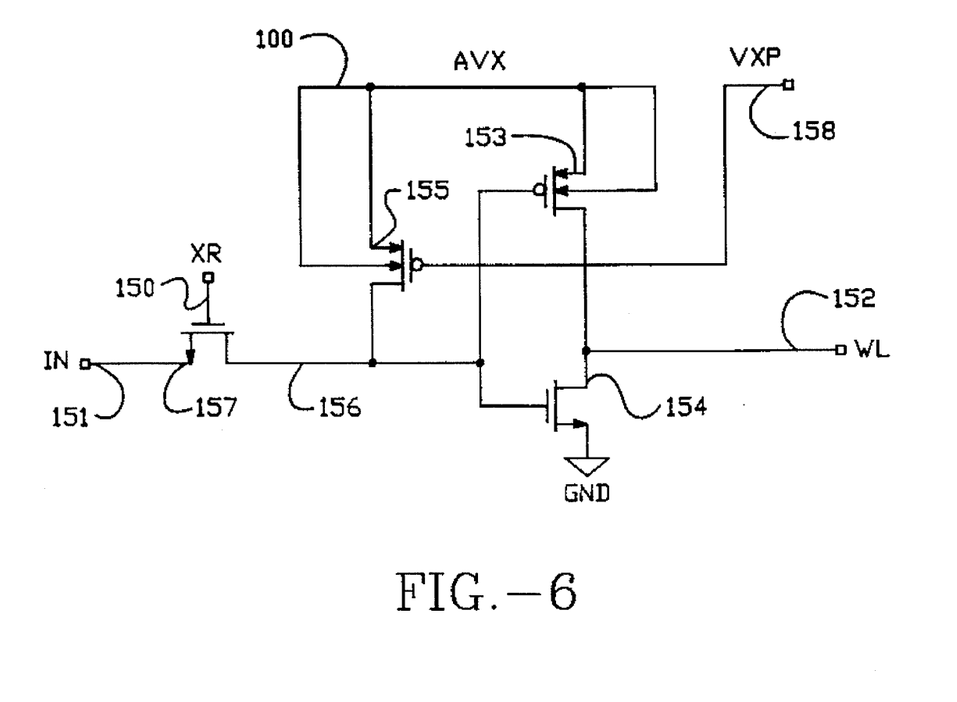
FIG. 6 is a schematic diagram of the word line driver for the system of FIG. 1.

FIGS. 4, 5, and 6 illustrate the circuitry used for generating the word line voltages for a memory device using the cell structure of FIGS. 2 and 3. In FIG. 4, an AVX generator is illustrated. The AVX generator supplies the AVX output on line 100 from a multiplexer 101. The multiplexer receives as inputs the $V_{DD}$ value on line 102, the $V_{PP}$ value on line 103, and the output of an erase verify/program verify driver on line 104. As noted in the figure, $V_{DD}$ is passed on as the AVX level during normal read operations. Similarly, $V_{PP}$ is passed on as the AVX level during program operations. During erase verify or program verify, the driver, generally 105, is used to establish the level of AVX. The driver 105 is controlled by the level of $V_{PP}$ on line 106. It comprises a controllable voltage source having a first n-channel transistor 107 having its gate and drain coupled to terminal 106 and its source coupled to the drain of second n-channel transistor 108. The source of second n-channel 108 is coupled to the drain of third n-channel transistor 109. The source of n-channel transistor 109 is coupled to node 110. Similarly, n-channel transistor 111, having its gate and drain coupled to node 106, is included. The source of transistor 111 is coupled to n-channel transistor 112. The source of n-channel 112 is coupled to the drain of n-channel transistor 113. The source of n-channel 113 is coupled to node 110.

Node 110 is coupled to the drain of n-channel transistor 114, which has its gate tied to $V_{DD}$. The source of transistor 114 is coupled to node 115. Node 115 is coupled to the drain of transistor 116 and the drain of transistor 117. The sources of transistors 116 and 117 are coupled to node 118. Node 118 is coupled to the drain of transistor 119 which has its source coupled to ground.

During erase verify, control signal EVC is asserted at the gate of transistor 108, and control signal VFYN is asserted at the gate of transistor 119. The reference voltages EV1 and EV2 generated by the margin voltage generator 34 of FIG. 1 are applied to the gates of transistors 109 and 116, respectively. Also during erase verify, the control signal PVC and reference voltages PV1 and PV2 are disabled. This results in generation of a particular voltage on line 104 which is defined by the levels EV1 and EV2.

During program verify, the control signals PVC and VFYN are asserted and the reference voltages PV1 and PV2 are applied to the gates of transistors 113 and 117, respectively, and EV1, EV2, and EVC are disabled. This results in the generation of a particular voltage on line 104 for supply as AVX on line 100 during program verify defined by PV1 and PV2.

The reference voltages EV1, EV2, EVC, PV1, PV2, and PVC are generated by voltage margin generator 34. The voltage margin generator in the preferred embodiment is illustrated in FIG. 5.

The voltage margin generator in FIG. 5 is based primarily on two voltage dividers composed of respective series of diode connected p-channel transistors, formed in n-wells and having their sources coupled to the n-well. Also, each voltage divider is driven by its respective control logic.

Thus, the voltage divider for the program verify mode receives as inputs the $V_{PP}$ potential on line 200, the PGM-VFY control signal on line 201 which is asserted high during program verify mode, and the VPPH signal on line 202, which goes high to $V_{DD}$ when the $V_{PP}$ supply voltage 200 goes high. Thus, the PGMVFY signal on line 201 is connected to inverter 203. The output of inverter 203 is connected to pass transistor 206 which has its gate connected to $V_{DD}$. The drain of pass transistor 206 is supplied as input to a second control gate which is composed of p-channel transistor 207, p-channel transistor 208, n-channel transistor 209, and n-channel transistor 210, all of which are connected in series. The gates of transistors 207 and 210 are connected to the output of transistor 206. The gate of transistor 209 is connected to $V_{DD}$. The gate of transistor 208 is connected to the VPPH line 202. Also, the output of transistor 206 is coupled to the drain of p-channel transistor 211 which as its source coupled to $V_{PP}$ and its gate connected to the node between transistors 208 and 209.

The node 299 between transistors 208 and 209 is supplied out as the PVC control signal, and gets pulled up to the $V_{PP}$ value during program verify mode. Also, the node 299 is connected to a next inverter which is composed of p-channel transistor 212, p-channel transistor 213, n-channel transistor 214, and n-channel transistor 215 connected in series. The node 299 is connected to the gates of transistors 212 and 215. The gate of transistor 214 is coupled to $V_{DD}$, and the gate of p-channel transistor 213 is coupled to the VPPH signal on line 202.

As indicated by lines 216 and 217, the p-channel transistors 207, 208, 212, 213 are formed in n-wells 216 and 217 which are coupled to the $V_{PP}$ terminal 200.

Whether a $V_{PP}$ is at high voltage or not, transistors 208 and 213 are always on. However, when VPPH is at $V_{DD}$, transistors 213 and 208 are more resistive than when VPPH is low. Thus, these transistors provide protection to the inverter during the high voltage transitions.

The resistive voltage divider which generates the reference voltages PV1, PVS, and PV2 is enabled by the signal on the node 224 between transistors 213 and 214, which is pulled down during the program verify mode.

The voltage divider is comprised of p-channel transistors 218 through 223. The gate of p-channel transistor 218 is connected to the signal on line 224 at the node between transistors 213 and 214. The source of transistor 218 is coupled to $V_{PP}$ and to the n-well in which it is formed. P-channel transistors 219 through 223 are all diode connected, having their gates and drains connected together.

Also, each of the transistors is formed in a separate n-well coupled to its source.

The signal PV1 is generated on line 225 which is connected to the node between transistors 219 and 220. N-channel transistors 226 and 227 are coupled in series between line 225 and ground. The gate of transistor 226 is coupled to $V_{DD}$. The gate of transistor 227 is coupled to control line 228.

The reference voltage PVS is generated on line 229 which is connected to the node between transistors 221 and 222. Line 229 is also connected to n-channel transistors 230 and 231 connected in series to ground. N-channel transistor 230 has its gate coupled to $V_{DD}$, and n-channel transistor 231 has its gate connected to the control line 232.

The signal PV2 is generated on line 232. Line 232 is coupled to the node between transistors 222 and 223. Also, line 232 is coupled to n-channel transistor 233 which as its gate connected to control line 228 and its source coupled to ground.

The control line 228 is derived from the PGMVFY signal on line 201 through inverters 234, 235, and 236. Thus, control line 228 is low when PGMVFY on line 201 is high. This enables the outputs PV1, PVS, and PV2 for the program verify operation.

The voltage divider circuit for the erase verify mode has the same general control logic, generally 250, as the voltage divider for the program verify mode. Thus, the control logic 250 will not be described in the text. Of course, the control logic 250 is controlled by the ERSVFY signal on line 251, rather than PGMVFY on line 201. The EVC signal is asserted on line 253 during erase verify mode.

Also, the voltage divider for the erase verify controllable voltage source is slightly different. It consists of p-channel transistors 254 through 259, n-channel transistor 260, and p-channel transistor 261 connected in series between $V_{PP}$ at node 262 and ground at node 263. Transistor 254 has its gate connected to the output of the control logic 250 which enables the voltage divider during erase verify mode. The source and n-well of transistor 254 are coupled to $V_{PP}$ on line 262. The p-channel transistors 255 through 259 and 261 are diode connected with their gates and drains connected together and their sources coupled to the n-well in which they are formed, and connected in series. N-channel transistor 260 is diode connected with its gate coupled to its drain, and connected to the drain of p-channel transistor 259. The source of n-channel transistor 261 is coupled to the source of p-channel transistor 261.

The voltage EV1 is generated on line 264 which is connected to the node between transistors 257 and 258. Line 264 is also connected to n-channel transistor 265 and 266 connected in series to ground. The gate of n-channel transistors 265 is coupled to $V_{DD}$, and the gate of n-channel transistor 266 is coupled to the control line 267.

The reference voltage EVS is generated on line 268. Line 268 is connected to the node between transistors 258 and 259. N-channel transistors 269 and 270 are coupled in series between the line 268 and ground. The gate of n-channel transistor 269 is coupled to $V_{DD}$ and the gate of n-channel transistor 270 is coupled to control line 267.

The reference voltage EV2 is generated on line 271. Line 271 is connected to the node between transistors 260 and 259. N-channel transistor 272 is connected between line 271 and ground. The gate of transistor 272 is connected to the control line 267. Thus, the reference voltages EV1, EVS, and EV2 are generated during erase verify mode.

For the typical case, $V_{DD}$ is 5 V±0.5 V, for a possible range of 5.5 V to 4.5 V, or ±10%. The typical case, the programming potential $V_{PP}$ is 12 V±0.6 V, for a range from 12.6 V to 11.4 V, or ±5%. Thus, the $V_{PP}$ potential is a more tightly controlled value than $V_{DD}$, percentage-wise. Using $V_{PP}$ in the voltage margin generator results in more carefully controlled reference voltages PV1, PVS, PV2, EV1, EVS, and EV2 than are possible on similar circuits based on $V_{DD}$.

Thus, the levels for a preferred embodiment of the present invention of the signals involved in the circuits of FIGS. 4 and 5 are shown in the following table along with the sense ratio SR based upon adjustment of R1/R2 for the read mode, the erase verify EVFY mode, and the program verify PVFY mode.

|      | READ      | EVFY         | PVFY         |
| ---- | --------- | ------------ | ------------ |
| AVX  | 5 V ± 10% | 4.8 V ± 5%   | 6.5 V ± 5%   |
| EVS  | 0 V       | 5.05 V ± 5%  | 0 V          |
| PVS  | 0 V       | 0 V          | 4.75 V ± 5%  |
| EV1  | 0 V       | 6.81 V ± 5%  | 0 V          |
| EV2  | 0 V       | 3.1 V ± 5%   | 0 V          |
| PV1  | 0 V       | 0 V          | 9 V ± 5%     |
| PV2  | 0 V       | 0 V          | 2.8 V ± 5%   |
| EVC  | 0 V       | 12 V ± 5%    | 0 V          |
| PVC  | 0 V       | 0 V          | 12 V ± 5%    |
| VFYN | 0 V       | 5 V          | 5 V          |
| SR   | 2.5       | 1.5          | 2.5          |

The use of p-channel diode connected transistors having their n-wells tied to their sources provides a very small die area for the voltage divider, and consumes a relatively small amount of power.

The use of n-channel transistor 261 for the controllable voltage source generating the erase verify references, compensates for the n-channel threshold voltage variations of the AVX generator circuit shown in FIG. 4. As a result, the voltage AVX generated by the circuit of FIG. 4 does not depend on the n-channel variation in threshold which arise due to process variations and the like.

FIG. 6 illustrates the implementation of the word line driver. There is a word line driver for each word line in the array, which is controlled by the row decoder shown in FIG. 1. The word line driver receives an input XR from decoding circuitry on line 150, an enable signal IN on line 151, and control signal VXP on line 158. The word line is driven on line 152 at the output of a voltage level translation circuit.

The voltage level translator in FIG. 6 is composed of the inverter including p-channel transistor 153 and n-channel transistor 154 and pass transistor 157. Pass transistor 157 has its source connected to the input terminal 151 and its drain connected to line 156. The gate of transistor 157 receives the control signal XR on line 150 from the decoding circuitry. The gates of transistors 153 and 154 are connected to line 156. The word line 152 is connected to the node between transistors 153 and 154. The source of transistor 154 is connected to ground and the source of transistor 153 is connected to the AVX line 100. Also, the n-well in which the p-channel transistor 153 is formed is coupled to the AVX line 100.

P-channel transistor 155 has its drain connected to line 156 and its source connected to the AVX terminal. Transistor 155 serves as a ratio pull up transistor for a NAND gate driver which supplies the signal IN on line 151. The n-well in which the transistor 155 is formed is also connected to the AVX line 100. The gate of transistor 155 is connected to control signal VXP on line 158 which serves to regulate the strength of pull up transistor 155.

Thus, the level translator shown in FIG. 6 supplies substantially the voltage AVX on the word line 152 when enabled by an input signal at substantially the $V_{DD}$ level. Because of the more careful control of the $V_{PP}$ potential, the AVX potential is also more carefully controlled, resulting in a word line voltage during the erase and program verify modes with more tightly specified values, as explained above.

Figure 7:
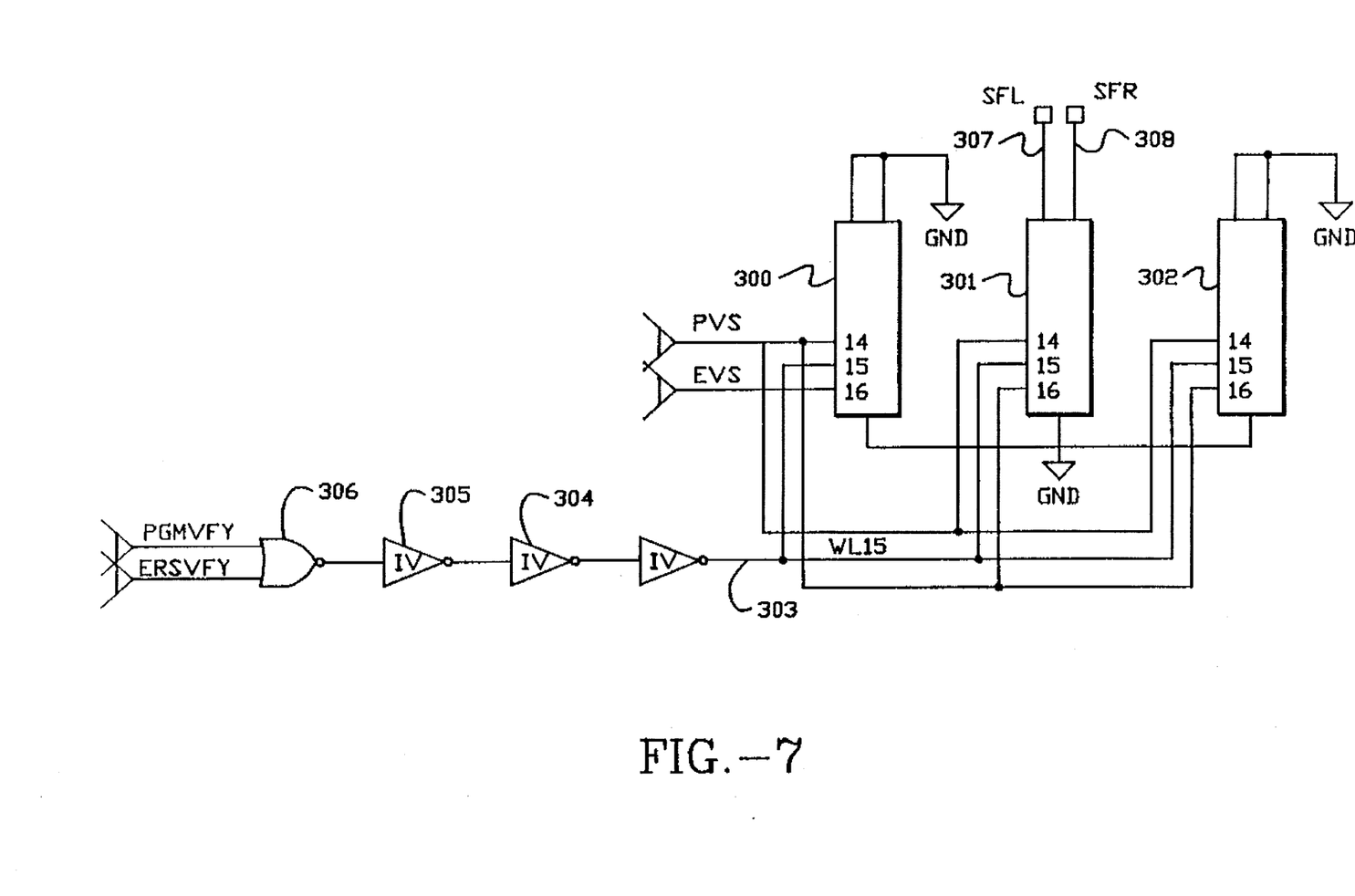
FIG. 7 is an expanded block diagram of the reference mini-array for the system of FIG. 1.

FIG. 7 illustrates a preferred embodiment of the reference mini-array 23 for the system employing cells of FIG. 2. The reference mini-array shown in FIG. 7 includes three pairs of columns of cells 300, 301, and 302. Each pair, 300, 301, 302, is implemented as shown in FIG. 3. The column pair 300 has its bit lines coupled to ground. The column pair 302 has its bit lines coupled to ground. The column pair 301 drives SFL and SFR lines 307 and 308 used as reference for sensing circuitry. The SFL and SFR bit lines 307, 308 are connected to lines corresponding to BL0 and BL1 of FIG. 3.

As can be seen, word lines 14, 15, and 16 of the blocks of reference cells are coupled to the PVS, $V_{DD}$, and EVS values, respectively. The $V_{DD}$ value is generated on line 303 at the output of inverter 304. Inverter 304 is driven by inverter 305. Inverter 305 is driven by NOR gate 306. NOR gate 306 receives as inputs the PGMVFY and ERSVFY signals. Therefore, the signal on line 303 is driven with $V_{DD}$ if the circuit is in the read mode. Otherwise, the signal on line 303 is substantially grounded. The PVS and EVS signals are controlled by the voltage margin circuit shown in FIG. 4 as described above.

The reference array shown drives three reference cells with particular energizing voltages. Alternative systems may multiplex the three levels to the word line of a single reference cell, or another combination of cells as suits a designer.

Figure 8:
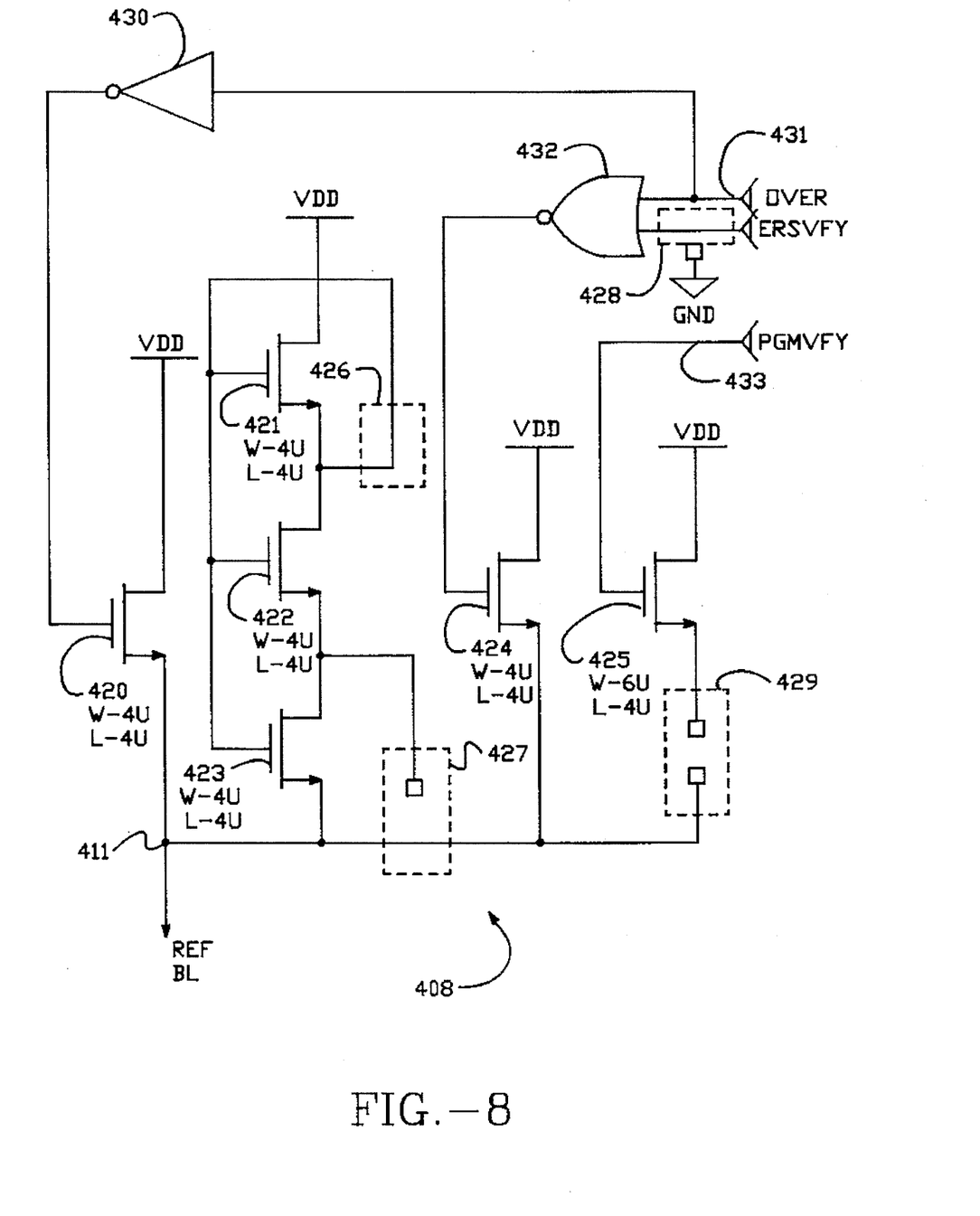
FIG. 8 is a schematic diagram of the bit line load circuitry for the reference bit line involved in the sense ratio parameter for the system of FIG. 1.

The SFL and SFR bit lines 307 and 308 are coupled to a reference bit line load as shown in FIG. 8, through a least significant bit decode enabling one or the other. The load circuitry, generally 408, shown in FIG. 8, is designed using mask options so that an integrated circuit incorporating the load circuit 408 may be easily modified to achieve a variety of effects.

According to one mask option, the resistance R2 affected by the load circuitry 408 is constant in the erase verify, program verify, and read modes. According to other mask options, the ability to change the resistance R2 is provided to adjust the sense ratio.

The load circuitry 408 consists of transistors 420 through 425, as shown in the figure, having the widths and lengths shown by way of example. Four mask options 426, 427, 428, and 429 are designed into the circuitry.

Mask option 428 is closed to provide for adjustment of the sense ratio during erase verify. If opened, mask option 428 connects ground to the input of NOR gate 432, so that no adjustment is made during erase verify. Mask option 429 is left open if the sense ratio is to remain constant during the program verify mode. Otherwise, the mask option 429 is closed to allow adjustment. Mask options 426 and 427 are used for adjustments of the sense ratio in general.

Thus, in the mode illustrated where mask option 429 is open, transistors 420 through 424 are involved in the sense ratio parameter. Transistor 420 is coupled between node 411 and $V_{DD}$. Its gate is driven by the output of inverter 430, which receives the OVER signal on line 431 as input. Transistors 423, 422, and 421 are connected in series between the node 411 and $V_{DD}$. Their gates are connected together and to the terminal $V_{DD}$. According to mask option 426, transistor 421 is bypassed so that only transistors 422 and 423 contribute to the load resistance. By opening mask option 426, this resistance can be increased. Similarly, by closing mask option 427, this resistance can be decreased.

Transistor 424 is connected between terminal 411 and $V_{DD}$. Its gate is driven by the output of NOR gate 432. The inputs to NOR gate 432 include the OVER signal on line 431, and, depending on mask option 428, either GND or an erase verify control signal ERSVFY.

The OVER signal is only asserted during an over erase checking mode. Thus, it is normally low, which turns on transistors 420 and 424 so that they participate in the sense ratio resistance. The sense ratio in the preferred system is about 2.5 in this condition. It may be adjusted up to about 3 and down to about 2.33 using the mask options 426 and 427, as mentioned above.

With the mask option 428 connected as shown, then the sense ratio during erase verify is adjusted by disabling transistor 424 to increase the impedance. This has the effect of lowering the sense ratio to about 1.5. Similarly, during program verify, mask option 429 may be connected so that transistor 425 is enabled by the PGMVFY control signal on line 433. This has the effect of reducing the impedance and increasing the sense ratio to about 4.0 during the program verify mode.

The sizes of the transistors are provided in FIG. 8 by way of example. It will be appreciated by those of skill in the art that the resistance of the load circuitry 408 may be manipulated by manipulating the widths and lengths of the MOS transistors involved.

In summary, the present invention provides the program verify and erase verify margins by applying different potentials from a $V_{PP}$ divider to the word lines in the memory array than to the word lines in the reference array, during the program and erase verify modes. Because the margins are a strong function of the difference in potential on the word lines, the margins can be easily adjusted and built-in to a specific design without varying the sense ratio. Furthermore, because the margins are determined using a margin generator responsive to the more tightly controlled programming potential $V_{PP}$, better performance is achieved compared to prior art designs which generate the word line potentials during these modes based on the less tightly controlled supply voltage $V_{DD}$. Furthermore, the margin voltage generator 34 of the present invention is implemented using a unique structure using a small die area, low power and which compensates for threshold variations which may affect the ultimate values generated by the circuit.

Therefore, a non-volatile integrated circuit memory device is provided with erase verify and program verify modes that can be more precisely controlled than prior art systems.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. For a non-volatile memory device with programmable memory cells having control terminals, and a reference cell having a control terminal, and sense circuitry responsive to addressed programmable memory cells and the reference cell, and having a read potential supplied to the control terminals of the programmable memory cells and a reference potential supplied to the control terminal of the reference cell during a read mode, a method for verifying a state of the programmable memory cells, comprising:

supplying a first verify potential to the control terminal of an addressed programmable memory cell, supplying a second verify potential to the control terminal of the reference cell different from the first verify potential; and sensing the state of the addressed programmable memory cell with the sense circuitry during said supplying steps.

2. The method of claim 1, wherein the reference potential and the read potential are substantially equal during the read mode.

3. The method of claim 1, for verifying a state of the programmable memory cells which is non-conductive in response to the read potential applied to the control terminal of the programmable memory cells, wherein the second verify potential is less than the first verify potential.

4. The method of claim 1 for verifying a state of the programmable memory cells which is conductive in response to the read potential applied to the control terminals of the programmable memory cells, wherein the second verify potential is greater than the first verify potential.

5. The method of claim 3, wherein the first verify potential is greater than the read potential.

6. The method of claim 4, wherein the first verify potential is less than the read potential.

7. The method of claim 1, wherein the sense circuitry includes a reference bit line coupled to the reference cell, the reference bit line having a characteristic load during the read mode, and including:

increasing the load on the reference bit line during the step of supplying the second verify potential to the control terminal of the reference cell.

* * * * *